United States Patent
Savari

(10) Patent No.: US 7,081,839 B2
(45) Date of Patent: Jul. 25, 2006

(54) METHOD AND APPARATUS FOR COMPRESSING AN INPUT STRING TO PROVIDE AN EQUIVALENT DECOMPRESSED OUTPUT STRING

(75) Inventor: Serap Ayse Savari, Ann Arbor, MI (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/660,117

(22) Filed: Sep. 11, 2003

(65) Prior Publication Data

US 2005/0057378 A1 Mar. 17, 2005

(51) Int. Cl.
*H03M 7/00* (2006.01)

(52) U.S. Cl. .......................................... 341/107; 341/50

(58) Field of Classification Search ................ 341/106, 341/50, 51, 107; 707/3; 704/500
See application file for complete search history.

(56) References Cited

U.S. PATENT DOCUMENTS

| | | | | |
|---|---|---|---|---|
| 6,311,179 B1 * | 10/2001 | Agarwal et al. | ............... | 707/3 |
| 6,801,141 B1 * | 10/2004 | Yang et al. | ................... | 341/51 |
| 2003/0130855 A1 * | 7/2003 | Babu et al. | .................. | 704/500 |

FOREIGN PATENT DOCUMENTS

WO    WO 03/021864 A2    9/2002

OTHER PUBLICATIONS

Drinić et al., "PPMexe: PPM for Compressing Software," Proc. IEEE Data Comp. Conf., 192-201, Snowbird, UT (Mar. 2002).
S.A. Savari, "Compression of Words Over A Partially Commutative Alphabet," Information Sciences (IS) Seminar, Cal. Tech. (Aug. 27, 2003).
S.A. Savari, "On Compressing Interchange Classes of Events in a Concurrent System," Proc. of IEEE Data Compression Conference, Snowbird, Utah (Mar. 2003).
D. Perrin, "Words Over a Partially Commutative Alphabet", in A. Apostolico and Z. Galil, ed., Combinatorial Algorithms on Words, NATO ASI Series, vol. F12, pp. 329-340, (Springer, Berlin, 1985), no month.

* cited by examiner

*Primary Examiner*—Peguy JeanPierre

(57) ABSTRACT

A method and apparatus are disclosed that compress an input string to an equivalent word relative to a noncommutation graph. The disclosed compression system compresses an input string in a manner that an equivalent string is produced upon decompression. The disclosed compression algorithms are based upon normal forms. First, a normal form of the interchange class is produced containing the source output string. Thereafter, a grammar-based lossless data compression scheme (or another compression scheme) is applied to the normal form. Upon decompression, the compressed string produces an equivalent string. A normal form generation process is employed to compute the lexicographic normal form or the Foata normal form of an interchange class from one of its members, using only a single pass over the data.

20 Claims, 2 Drawing Sheets

METHOD AND APPARATUS FOR COMPRESSING AN INPUT STRING TO PROVIDE AN EQUIVALENT DECOMPRESSED OUTPUT STRING

FIELD OF THE INVENTION

The present invention relates generally to data compression techniques, and more particularly, to methods and apparatus for compressing an input string in a manner that an equivalent string relative to a noncommutation graph is produced upon decompression.

BACKGROUND OF THE INVENTION

The ordering of events is fundamental to the study of the dynamic behavior of a system. In a sequential process, it is natural to use strings of symbols over some alphabet to specify the temporal ordering of events. The symbols may, for example, correspond to the states, commands, or messages in a computation. J. Larus, "Whole Program Paths," ACM SIGPLAN Conf. Prog. Lang. Des. Implem., 259–69 (May, 1999), applies a lossless data compression algorithm known as "Sequitur" to the sequence of events or signals determining the control flow or operations of a program's execution. Sequitur is an example of a family of data compression algorithms known as grammar-based codes that take a string of discrete symbols and produce a set of hierarchical rules that rewrite the string as a context-free grammar that is capable of generating only the string. These codes have an advantage over other compression schemes in that they offer insights into the hierarchical structure of the original string. J. Larus demonstrated that the grammar which is output from Sequitur can be exploited to identify performance tuning opportunities via heavily executed subsequences of operations.

The underlying premise in using lossless data compression for this application is the existence of a well-defined linear ordering of events in time. A partial ordering of events is a more accurate model for concurrent systems, such as multiprocessor configurations, distributed systems and communication networks, which consist of a collection of distinct processes that communicate with one another or synchronize at times but are also partly autonomous. These complex systems permit independence of some events occurring in the individual processes while others must happen in a predetermined order. Noncommutation graphs are used for one model of concurrent systems. To extend Larus' ideas to concurrent systems a technique is considered for compressing an input string in a manner that an equivalent string relative to a noncommutation graph is produced upon decompression.

The compression of program binaries is important for the performance of software delivery platforms. Program binaries are files whose content must be interpreted by a program or hardware processor that knows how the data inside the file is formatted. M. Drinić and D. Kirovski, "PPMexe: PPM for Compressing Software," Proc. 1997 IEEE Data Comp. Conf., 192–201 (March 2002), discloses a compression mechanism for program binaries that explore the syntax and semantics of the program to achieve improved compression rates. They also compress data relative to a noncommutation graph. The disclosed compression algorithm employs the generic paradigm of prediction by partial matching (PPM). While the disclosed compression algorithm performs well for many applications, it introduces certain inefficiencies in terms of compression and delays.

A need therefore exists for a more efficient algorithm for compressing an input string given a set of equivalent words derived from a noncommutation graph. A further need exists for a decompression technique that reproduces a string that is equivalent to the original string.

SUMMARY OF THE INVENTION

Generally, a method and apparatus are provided for compressing an input string relative to a noncommutation graph. The disclosed compression system compresses an input string in a manner that an equivalent string is produced upon decompression. The disclosed compression algorithms are based upon normal forms (i.e., a canonical representation of an interchange or equivalence class). Generally, the disclosed compression process can be decomposed into two parts. First, a normal form of the interchange class is produced containing the source output string. Thereafter, a grammar-based lossless data compression scheme (or another compression scheme) is applied to the normal form. Upon decompression, the compressed string produces an equivalent string.

A normal form generation process is employed to compute the lexicographic normal form or the Foata normal form of an interchange class from one of its members, using only a single pass over the data.

A more complete understanding of the present invention, as well as further features and advantages of the present invention, will be obtained by reference to the following detailed description and drawings.

DETAILED DESCRIPTION

Figure 1:
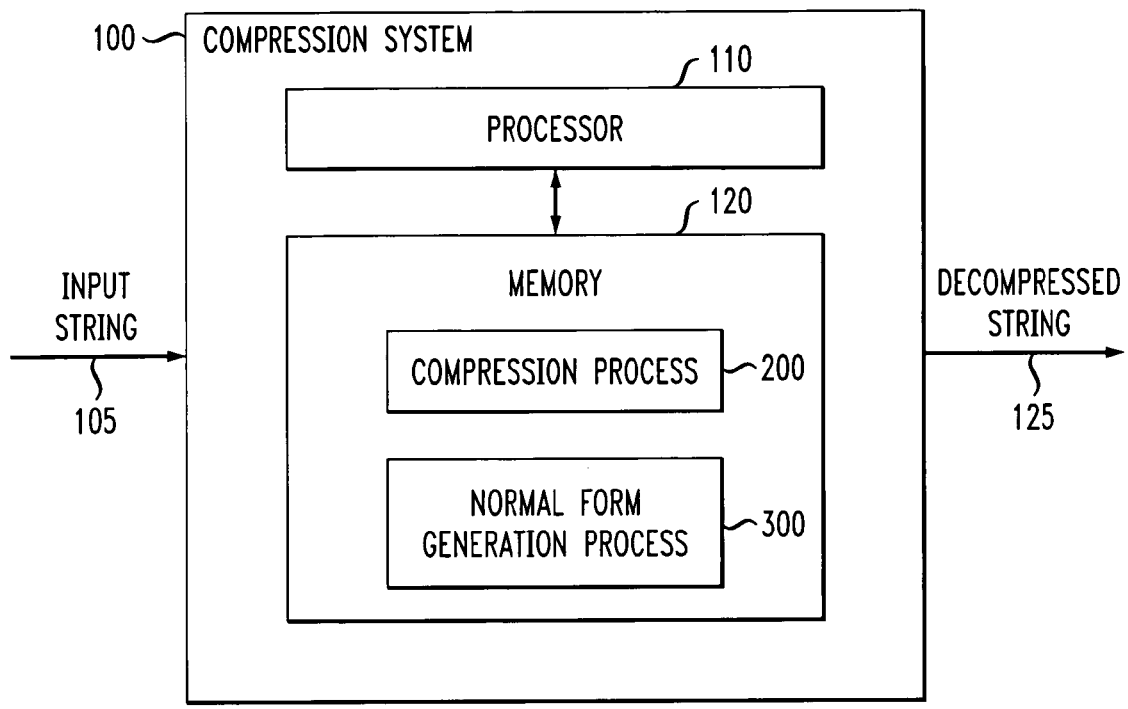
FIG. 1 illustrates a compression system in which the present invention may be employed.

FIG. 1 illustrates a compression system 100 in which the present invention may be employed. As shown in FIG. 1, the exemplary compression system 100 includes a processor 110 and memory 120. According to one aspect of the invention, the compression system 100 compresses an input string 105 in a manner that an equivalent string 125 is produced upon decompression. As shown in FIG. 1, the memory 120 includes a compression process 200, discussed further below in conjunction with FIG. 2, and a normal form generation process 300, discussed further below in conjunction with FIG. 3, that may be employed by the compression process of FIG. 2.

Figure 2:
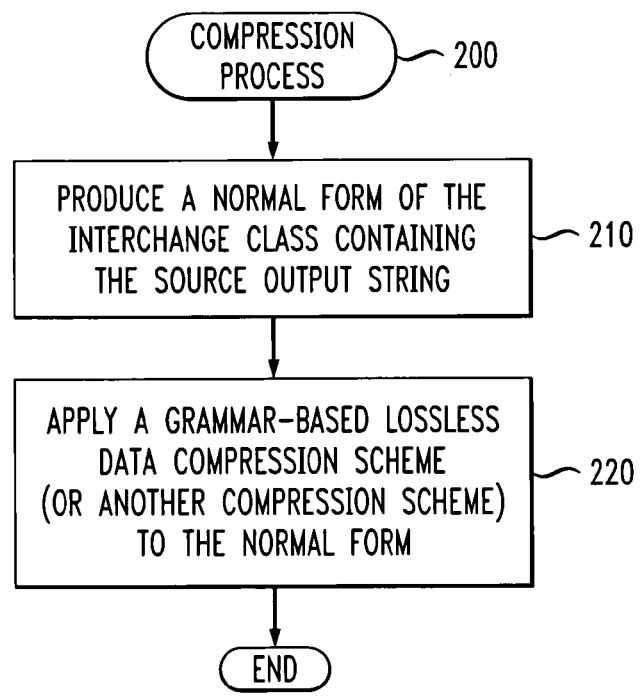
FIG. 2 is a flow chart describing an exemplary implementation of the compression process of FIG. 1.

The present invention provides compression algorithms based upon variations of a standard notion in trace theory known as normal forms. A normal form is a canonical representation of an interchange class. FIG. 2 is a flow chart describing an exemplary implementation of the compression process 200 of FIG. 1. Generally, the disclosed compression process 200 can be decomposed into two parts. As shown in FIG. 2, the compression process 200 initially produces a normal form of the interchange class containing the source output string during step 210. Thereafter, the compression process 200 applies a grammar-based lossless data compression scheme (or another compression scheme) to the normal form during step 220, before program control terminates. Upon decompression, the compressed string produces an equivalent string.

The 1978 Lempel-Ziv data compression scheme (LZ '78), described, for example, in J. Ziv and A. Lempel, "Compression of Individual Sequences Via Variable-Rate Coding," IEEE Trans. Inform. Theory IT-24, 530–36 (1978), can be viewed as an example of a grammar-based code. LZ '78 asymptotically compresses the output of an ergodic source to the source entropy with probability 1. J. C. Kieffer and E.-H. Yang, "Grammar-Based Codes: A New Class of Universal Lossless Source Codes," IEEE Trans. Inform. Theory 46, 737–54 (2000), defines the notion of an irreducible grammar transform and demonstrates that any grammar-based codes that use an irreducible grammar transform is also universal in the sense that it almost surely asymptotically compresses the output of an ergodic source to the source entropy. In the illustrative embodiments described herein, any universal grammar-based lossless data compression scheme may be employed. While it is unknown if Sequitur is a universal compression technique, J. C. Kieffer and E. -H. Yang offers a modification of Sequitur that is provably universal.

Two examples are discussed for which the codes of the present invention attain a new graph entropy referred to herein as the interchange entropy. In both cases, it is assumed for simplicity that the original source string was the output of a discrete, memoryless source; the analysis can be extended to finite-state, unifilar Markov sources, as would be apparent to a person of ordinary skill. In one instance, the dependence relation on the source alphabet is a complete k-partite graph and in the other case, the noncommutation graph contains at least one vertex which is adjacent to all others. For a further discussion of interchange entropy, see, S. A. Savari, "Concurrent Processes and the Interchange Entropy," Proc. of IEEE International Symposium on Information Theory, (Yokohama, Japan, July 2003); S. A. Savari, "On Compressing Interchange Classes of Events in a Concurrent System," Proc. of IEEE Data Compression Conference, (Snowbird, Utah, March 2003), or S. A. Savari, "Compression of Words Over A Partially Commutative Alphabet," Information Sciences (IS) Seminar, Cal. Tech., Aug. 27, 2003, each incorporated by reference herein.

Dependence Relations

Trace theory is a known approach to extending the notions and results pertaining to strings in order to treat the partial ordering of event occurrences in concurrent systems. The idea is to combine the sequence of atomic actions observed by a single witness of a concurrent system with a labeled and undirected dependence relation or noncommutation graph specifying which actions can be executed independently or concurrently. Two words with symbols over a vertex set V are congruent or equivalent with respect to a noncommutation graph G if each can be obtained from the other through a process of interchanging consecutive letters that are non-adjacent vertices in G. For example, if the noncommutation graph G is given by a-b-c-d then the two words ddbca and bdadc are congruent since $ddbca \equiv_G dbdca \equiv_G dbdac \equiv_G dbadc \equiv_G bdadc$.

There are two special cases of the dependence relation which are standard in information theory. When G is the complete graph on the vertex set V, i.e., when there is an edge connecting every pair of vertices, every word over V is congruent only to itself. At the other extreme, if G is the empty graph on the vertex set, i.e., if no two vertices are adjacent, then two words are congruent if and only if the number of occurrences of each symbol in V is the same for both words. The equivalence classes on words are frequently called type classes or composition classes in the information theory literature and rearrangement classes or abelian classes in combinatorics. A congruence class of words for an arbitrary noncommutation graph G is often referred to as a trace because they represent traces of processes, i.e., the sequence of states traversed by the process from initialization to termination, in nonsequential systems. Because the word trace has numerous connotations, the term interchange class is used herein to refer to an equivalence class of words.

Motivated by the success of J. Larus in applying lossless data compression algorithms to a string of events in a sequential system, R. Alur et al., "Compression of Partially Ordered Strings," 14th Int'l Conf. on Concurrency Theory (CONCUR 2003), (Sep. 3, 2003), introduces a compression problem where it is only necessary to reproduce a string which is in the same interchange class as the original string. R. Alur et al. describes some compression schemes for the congruence class of a string that in the best cases can be exponentially more succinct than the optimal grammar-based representation of the corresponding string. This compression problem also appears in the compression of executable code. As previously indicated, executable code or program "binaries" are files whose content must be interpreted by a program or hardware processor which knows exactly how the data inside the file is formatted in order to utilize it. One of the techniques given in M. Drinić and D. Kirovski for this compression application is "instruction rescheduling," in which instructions can be reordered if the decompressed program is execution-isomorphic to the original.

Interchange Entropy

The present invention considers this compression problem from an information theoretic perspective. A new generalization of Kolmogorov-Chaitin complexity referred to as the interchange complexity is proposed and a version of the subadditive ergodic theorem is used to provide sufficient conditions on probabilistic sources so that an extension of the asymptotic equipartition property to interchange classes holds. The average number of bits per symbol needed to represent an interchange class is referred to as the interchange entropy. The interchange entropy is a functional on a graph with a probability distribution on its vertex set.

For memoryless sources, there are two earlier graph entropies which have received considerable attention. The Korner graph, described, for example, in J. Korner, "Coding of an Information Source Having Ambiguous Alphabet and the Entropy of Graphs," in Proc. 6th Prague Conf. on Information Theory, 411–25 (1973); or G. Simonyi, "Graph Entropy: A Survey," in L. Lovász, P. Seymour, and W. Cook, ed., DIMACS Vol. 20 on Special Year on Combinatorial Optimization, 399–441 (1995), has been found to have applications in network information theory, characterization of perfect graphs, and lower bounds on perfect hashing, Boolean formulae size and sorting. Chromatic entropy was defined in connection with certain parallel-computing models in R. B. Boppana, "Optimal Separation Between Concurrent-Write Parallel Machines," in Proc. 21st Ann. ACM Symp. Theory Comp., 320–26 (1989) and demonstrated in N. Alon and A. Orlitsky, "Source Coding and Graph Entropies," IEEE Trans. Inform. Theory 42, 1329–339 (1996), to be linked to the expected number of bits required by a transmitter to convey information to a receiver who has some related data. As discussed below, the interchange entropy has some properties in common with these other graph entropies. The compression algorithms of the present invention can asymptotically achieve the interchange entropy for a large collection of dependence alphabets.

R. Alur et al., referenced above, propose three methodologies for encoding a string given a partial order on the source alphabet. The first approach is to attempt to find a string equivalent to the source output string which compresses well. R. Alur et al. and M. Drinićand D. Kirovski put an alphabetical ordering on the symbols and sort the letters of the source output string to produce the equivalent string which is minimal under this ordering. The other algorithms of this variety simultaneously determine the equivalent string and a grammar-based code for it. These algorithms appear not to be easily amenable to an information theoretic analysis.

The second class of procedures put forward in R. Alur et al. involve projections of the string onto subsets of the alphabet. A projection of a string $\sigma$ on alphabet V onto a subalphabet $A \subseteq V$ is obtained by removing all symbols in $\sigma$ that are not in A. One of the encoding techniques described by R. Alur et al. projects the original string onto a set of subalphabets with the property that each symbol in V will be in at least one of the subalphabets and each pair of adjacent symbols in G will be in at least one of the subalphabets. Each of these projections is compressed and, as discussed below, it is possible to use the projections to reconstruct a string equivalent to $\sigma$. Another scheme for encoding a string given a partial order on the source alphabet considers the relabeling of symbols in addition to projections and interchanges.

Interchange Complexity and Interchange Entropy

The asymptotic equipartition property is central to the study of lossless data compression. It states that most long sequences from a discrete and finite alphabet ergodic source are typical in the sense that their mean self-information per symbol is close to the entropy of the source. A consequence of this result is that the average number of bits per symbol required to losslessly encode the output of an ergodic source is asymptotically bounded from below by the binary entropy of the source. In order to find a counterpart for this lossy compression problem, the least amount of information is considered about an individual string that must be described in order to reproduce another string within the same interchange class. The appropriate framework for this discussion is algorithmic information theory. For a finite length string x over the vertex set V, C(x) denotes the Kolmogorov complexity of x and refer to M. Li and P. Vitányi, An Introduction to Kolmogorov Complexity and Its Applications, 2d Ed., §2.1, 107, (Springer, New York, 1997), for the basic properties of C(x). Let V* be the set of all finite words from V and |V| denote the cardinality of V. The interchange complexity of $uv \equiv_G wx$ is defined with respect to a noncommutation graph G with vertex set V by:

$$C_i(G,x) = \min\{C(y) | y \in V^*, y \equiv_G x\}.$$

$C_i(G,x)$ has the interpretation of being the length of the shortest program for a universal computer that will print out a word y which is congruent to x with respect to the noncommutation graph G.

The following result is one way to characterize the equivalence of two strings with respect to a noncommutation graph G:

Theorem 2.1 (D. Perrin, "Words Over a Partially Commutative Alphabet," in A. Apostolico and Z. Galil, ed., Combinatorial Algorithms on Words, NATO ASI Series, Volume F12, 329–40 (Springer, Berlin, 1985)): For any subset A of the vertex set V and any word w over V, let $\pi_A(w)$ denote the projection of w onto A which is obtained by deleting from w all symbols which are not in A. The necessary and sufficient conditions for two words w and x to be congruent is that they are in the same type class and that $\pi_{\{u,v\}}(w) = \pi_{\{u,v\}}(w)$ for all pairs of symbols u,v∈V which are adjacent in G.

Since Theorem 2.1 specifies the necessary and sufficient conditions for two words to be congruent with respect to a non-commutation graph G, the interchange class containing a string can be completely determined by any element of the interchange class which can be used to provide the type class and edge projections. Conversely, given the type class and edge projections of an interchange class, it is possible to use a knowledge of these to produce a word in the interchange class for a noncommutation graph G as follows. If G is the empty graph, then it is straightforward to use the type class to reconstruct a word consistent with the type. If G is not the empty graph, the type class is used to determine the number of appearances of any symbol which commutes with every other symbol in V. The symbols appearing in the edge projections remain. The leftmost symbol in each projection is initially a possibility for the next symbol in our word. If there are any two symbols, say u and v, among these which do not commute, then the projection onto edge {u,v} determines which symbol appears first in the projection, and the other is removed from the set of possible next symbols. This procedure is iterated until the set of possible next symbols contains no pair of symbols which are adjacent in G. Any symbol from this set can be chosen as the next letter. If symbol u is chosen, then the leftmost u is removed from every edge projection onto u and its neighbors in G. This algorithm is repeated until every edge projection is empty. It follows that $C_i(G,x)$ can be viewed as the length, to within O(1), of the shortest program for a universal computer that will determine the interchange class containing x.

Suppose there are words u,v,w,x∈V* with $u \equiv_G w$ and $v \equiv_G x$. Then it is easily seen that the words uv and wx formed by respectively appending v to u and x to w satisfies $uv \equiv_G wx$. Therefore, the interchange complexity is almost subadditive. In particular, to bound $C_i(G,uv)$ from above, it is observed that one way to produce a string equivalent to uv is to use a shortest program p to find a string w equivalent to u, a shortest program q to construct a string x congruent to v, a means to schedule the two programs to produce w followed by x, and an identification of the programs p and q. Using this encoding technique it follows that:

$$C_i(G,uv) \leq C_i(G,u) + C_i(G,v) + 2\log_2(\min(C_i(G,u),C_i(G,u))) + 0(1). \tag{1}$$

Let l(u) denote the length of word u∈V*. $C_i(G,u) \leq C(u)$, u∈V* and $C(u) \leq l(u)\log_2|V| + 2\log_2|V| + c$ for some constant c independent of u and V. Hence, equation (1) implies that $$C_i(G,uv) \leq C_i(G,u) + C_i(G,v) + 2\log_2(\min(l(u),l(v))) + 0(1) \tag{2}$$

For a word $u_1 \ldots u_n$ with $u_i \in V, i \in \{1, \ldots, n\}$, the behavior of $n^{-1}C_i(G,u_1u_2 \ldots u_n)$ is considered for large n. The following result is directly employed:

Theorem 2.2 (N. G. DeBruijn and P. Erdös, "Some Linear and Some Quadratic Recursion Formulas I," Indag. Math. 13, 374–82 (1952)): Suppose φ is a positive and nondecreasing function that satisfies $$\int_1^\infty \frac{\phi(t)}{t^2} < \infty.$$

If $\{x_n\}$ satisfies the relaxed subadditivity relation $$x_{n+m} \leq x_n + x_m + \phi(n+m), \frac{n}{2} \leq m \leq 2_n$$

then as $n \to \infty$, $x_n/n$ converges to $\gamma = \inf_{m \geq 1} x_m/m$.

Hence equation (2) and Theorem 2.2 imply that the asymptotic per symbol information content needed to convey a word equivalent to the original bound is well-defined. More specifically:

Proposition 2.3: For any word $u_1 \ldots u_n$ with $u_i \in V, i \in \{1, 2 \ldots, n\}$, n approaches infinity, $n^{-1}C_i(G,u_1 \ldots u_n)$ converges to $\inf_{m \geq 1} m^{-1}C_1(G,u_1 \ldots u_m)$.

Next, a probabilistic version of Proposition 2.3 is found. The appropriate frame of reference is subadditive ergodic theory. The following theorem is utilized:

Theorem 2.4 (Y. Derriennic, "Un Théorème Ergodique Presque Sous-Additif," Ann. Prob. 11, 669–77 (1983)): Let $X_{m,n}$ and $A_{m,n}$, $m \leq n$, be two sequences of random variables with the following properties:
1) $X_{0,n} \leq X_{0,m} + X_{m,n} + A_{m,n}$.
2) $X_{m,n}$ is stationary, i.e., the joint distributions of $X_{m,n}$ are the same as the joint distributions of $X_{m+1,n+1}$ and ergodic.
3) $E[X_{0,1}] < \infty$ and for each n, $E[X_{0,n}] \geq c_0 n$ with $c_0 > -\infty$.
4) $A_{m,n} \geq 0$ and $\lim_{n \to \infty} E[A_{0,n}/n] = 0$.

Then $$\lim_{n \to \infty} \frac{X_{0,n}}{n} = \lim_{n \to \infty} \frac{E[X_{0,n}]}{n} = \inf_{m \geq 1} \frac{E[X_{0,m}]}{m}$$

almost surely.

Theorem 2.4 is applied to the output of two very broad categories of sources. A discrete source is said to be stationary if its probabilistic specification is independent of a time origin and ergodic if it cannot be separated into two or more different persisting modes of behavior. A more precise definition of a discrete, stationary, and ergodic source can be found in R. G. Gallager, Information Theory and Reliable Communication, §3.5 (Wiley, New York, 1968). A unifilar Markov source with finite alphabet V and finite set of states S is defined by specifying for each state $s \in S$ and letter $v \in V$
1) the probability $p_{s,v}$ that the source emits v from state s;
2) the unique next state $S[s, v]$ after v is output from state s.

Given any initial state $s_0 \in S$, these rules inductively specify both the probability $P(\sigma/s_0)$ that any given source string $\sigma \in V^*$ is emitted and the resulting state $S[s_0, \sigma]$ after $\sigma$ is output. For the null string $\emptyset$ and each state $s \in S$, the convention is that $P(\emptyset|s)=1$. It is assumed that the source has a single recurrent class of states; i.e., for each pair of states s and r, there is a non-null string $\sigma \in V^*$ such that $P(\sigma|s)>0$ and $S[s,\sigma]=r$. The class of unifilar Markov sources is fairly general and includes, for each $l \geq 1$, the group of sources for which each output depends statistically only on the l previous output symbols. The following result is obtained:

Theorem 2.5 (A.E.P. for interchange classes): Let $U_1, U_2, \ldots$ be the random output of a finite alphabet, discrete, stationary, and ergodic source or of a finite state and finite alphabet unifilar Markov source. Then $$\lim_{n \to \infty} \frac{C_i \cdot (G, U_1 U_2 \ldots U_N)}{n} = \lim_{n \to \infty} \frac{E[C_i(G, U_1 U_2 \ldots U_N)]}{n}$$
$$= \inf_{m \geq 1} \frac{E[C_i(G, U_1 U_2 \ldots U_M)]}{m}$$

almost surely.

Unless otherwise specified, it is assumed hereafter that we have probabilistic sources P in which the random variables $n^{-1}C_i(G, U_1 \ldots U_N)$ converge almost surely or in probability to $\lim_{n \to \infty} n^{-1}E[C_i(G, U_1 \ldots U_n)]$. The latter expression is referred to as the interchange entropy and is denoted by $H_i(G,P)$. Just as the asymptotic equipartition property for strings leads to a notion of typical sequences which all have about the same probability and together constitute the possible outputs of the source with high probability, Theorem 2.5 provides a comparable concept of typical interchange classes. Most long strings require close to $H_i(G,P)$ bits per symbol to describe an equivalent string with respect to the noncommutation graph G. It follows that the typical sequences of length n fall into approximately $2^{nH_i(G,P)}$ typical interchange classes.

It is generally considered to be difficult to determine or even bound the limiting constants obtained by a subadditivity argument. For the present problem, there are two straightforward approaches to bounding $H_i(G,P)$ from above. The first of these is to simply reproduce the exact source output string. For a discrete, ergodic source with finite alphabet and entropy $H(P)$, it is known that $n^{-1}C(U_1 \ldots U_n)$ converges to $H(P)$ with probability 1. This procedure is optimal when G is the complete graph on V. Another approach is to count the number of interchange classes for a particular string length and allocate a fixed-length codeword to each interchange class. More precisely, an alphabetic ordering can be assigned to the elements of the vertex set, follow T. M. Cover and J. A. Thomas, Elements of Information Theory, 152 (Wiley, New York, 1991), and use the program "Generate, in lexicographic order, all alphabetically minimal elements of the interchange classes of length n. Of these words, print the $i^{th}$ word."

The moment generating function for the number of interchange classes for words of a given length was shown to be equal to the inverse of the Mobius polynomial corresponding to a function of G. Recently, a formula for the dominant term in the asymptotic expansion of the number of traces was provided in M. Goldwurm and M. Santini, "Clique Polynomials Have a Unique Root of Smallest Modulus," Information Processing Letters 75(3), 127–132, (2000). In the special case where G is the empty graph, it is well known that the number of type classes of length n for a vertex set V with cardinality |V| is at most $(n+1)^{|V|}$. Hence, if G is the empty graph, then $H_i(G,P)=0$ for all probability distributions P. The Korner graph entropy and chromatic entropy are also known to be $H(P)$ when G is the complete graph on the vertex set and 0 when G is the empty graph on the vertex set.

The characterization of interchange classes by type class and edge projections provided in Theorem 2.1 implies that the interchange entropy is monotonic, subadditive, and for memoryless sources satisfies two special cases of additivity under vertex substitution. Let E denote the edge set of a graph.

Proposition 2.6 (Monotonicity): If F and G are two graphs on the same vertex set and the respective edge sets satisfy $E(F) \subseteq E(G)$, then for any word x we have $C_i(F,x) \leq C_i(G,x)$. Hence, for any probability distribution P we have $H_i(F,P) \leq H_i(G,P)$. The Korner graph entropy and chromatic entropy are also known to be monotonic.

Proposition 2.7 (Subadditivity): Let F and G be two graphs on the same vertex set V and define F∪G to be the graph on V with edge set $E(F) \cup E(G)$. For any word x, $C_i(F \cup G, x) \leq C_i(F,x) + C_i(G,x) + O(1)$. Therefore, for any fixed probability distribution P, $H_i(F \cup G, P) \leq H_i(F,P) + H_i(G,P)$. The Korner graph entropy is also subadditive.

The concept of substitution of a graph F for a vertex v in a disjoint graph G is described in G. Simonyi, §3. The idea is that v and the edges in G with v as an endpoint are removed and every vertex of F is connected to those vertices of G that were adjacent to v. This notion can be extended to a property of Korner graph entropy known as "additivity of substitution." The concept does not hold in general for the interchange entropy, but there are two special cases which apply. The first one is concerned with graphs consisting of more than one connected component.

Proposition 2.8: Let the subgraphs $G_j$ denote disjoint components of the graph G; i.e., there is no edge in E(G) with one endpoint in $V(G_j)$ and the other in $V(G_1)$ for $j \neq l$. For a memoryless source with probability distribution P on V(G) define the probability distributions"

$$P_j(x) = P(x)[p(V(G_j))]^{-1}, x \in V(G_j). \quad (3)$$

Then $$H_i = (G, P) = \sum_j P(V(G_j)) H_i(G_j, P_j).$$

An example illustrates that Proposition 2.8 fails in general to hold for the output of sources with memory. Suppose that V={a, b, c, d}, G=a-b c-d, and the source is an order-1 Markov chain with P(c|a)=P(d|b)=1, P(a|c)=P(b|c)=P(a|d)=P(b|d)=0.5. Assume that the first symbol is equally likely to be an a or a b. In other words, the source outputs two symbols at a time independently with half being ac and the other half being bd. It is easy to verify that the entropy of the original source is 0.5 bits per symbol. Next suppose F=a-b c-d. In order to represent a word congruent to the source output with respect to F, the projection of the string onto the subalphabet {a, b} must be precisely characterized. Note that this projection looks like the output of a binary, memoryless source with P(a)=P(b)=0.5. Since half of the symbols from the original string appear in the projection, it follows that $H_i(F,P)=0.5$ bits per symbol. Therefore Proposition 2.6 implies that $H_i(G,P)=0.5$ bits per symbol. Let $G_1$=a-b and $G_2$=c-d. Observe that $H_i(G,P) \neq P(V(G_1))H_i(G_1,P_1) + P(V(G_2))H_i(G_2,P_2)=1$ bit per symbol. The reason that Proposition 2.8 is invalid in this case is that the projection of source output symbols onto G2 is perfectly correlated with the projection of source output symbols onto G1 in that it can be obtained by replacing each a with a c and each b with a d.

A second example of additivity of substitution for the interchange entropy is considered assuming the original source string is the output of a memoryless source.

Proposition 2.9: Let F be a graph consisting of two vertices x and y and an edge connecting them, let G be a graph with vertex set disjoint from F, and let v be a vertex of G. Form the graph $G_{v \leftarrow F}$ by deleting v and joining both vertices of F to those vertices of G which were adjacent to v. For a memoryless sources with probability distribution $P_{v \leftarrow F}$ on $V(G_{v \leftarrow F})$, we define two auxiliary memoryless sources, one over V (G) with probability distribution P and the other over V(F) with probability distribution Q as follows $$P(u) = \begin{cases} P_{v \leftarrow F}(u), & u \in V(G) - \{v\} \\ P_{v \leftarrow F}(x) + P_{v \leftarrow F}(y), & u = v \end{cases} \quad (4)$$

$$Q(x) = \frac{P_{v \leftarrow F}(x)}{P(v)}$$

$$Q(y) = \frac{P_{v \leftarrow F}(y)}{P(v)}$$

Then $H_i(G_{v \leftarrow F}, P_{v \leftarrow F}) = H_i(G,P) + P(v)H(Q)$.

For discrete memoryless sources, the exact expression is obtained for $H_i(G,P)$ in the case where G is a complete k-partite graph $K_{m_1, m_2, \ldots, m_k}$.

Theorem 2.10: Assume a discrete, memoryless source with probability distribution P on vertex set V. Suppose V is of the form $V = V_1 \cup V_2 \cup \ldots \cup V_K$ with $|V_i| = m_i, i \in \{1, 2, \ldots, k\}$ and label the elements of $V_i$ as $v_{i,j}, i \in \{1, 2, \ldots k\}, j \in \{1, 2, \ldots, m_i\}$. For our complete k-partite graph $K_{m_1, m_2, \ldots, m_k}$ there is an edge corresponding to every pair of vertices $\{v_{i,j}, v_{l,n}\}, v_{i,j} \in V_i, v_{l,n} \in V_1, l \neq i$, and no two vertices from the same subset $V_i$ are adjacent for any $i \in \{1, 2, \ldots, k\}$. Define $$Q_i = \sum_{j=1}^{m_i} P(v_i, j), i \in \{1, 2, \ldots, k\}.$$

Then $$H_i(K_{m_1, m_2, \ldots, m_k}, P) = H(P) - \sum_{S=2}^{\infty} \log_2(S) \sum_{i: m_i \geq 2} (1 - Q_i)$$

$$\left( Q_i^S - \sum_{j=1}^{m_i} \left( \frac{P(v_{i,j})}{1 - Q_i + P(v_{i,j})} \right)^S \right).$$

Theorem 2.10 leads to the following property of the interchange entropy for the output from a discrete, memoryless source.

Corollary 2.11: Assume a discrete, memoryless source with probability distribution P on vertex set V(G). If G is not the complete graph on V(G), then $H_i(G,P) < H(P)$.

The example following Proposition 2.8 illustrates that it is possible for a source with memory to satisfy $H_i(G,P) = H(P)$ even when the dependence relation G is not the complete graph on V(G).

An example illustrates some of the results in this section. Suppose the noncommutation graph G is a-b-c and P(a)=P(b)=P(c)=⅓. A simple upper bound for $H_i(G,P)$ is $H_i(G,P) \leq H(P) = \log_2 3 \approx 1.58496$. Define the graphs $F_1$=a-b c, $F_2$=a b-c, $F_3$=c-a b. By symmetry, $H_i(F_1,P) = H_i(F_2,P) = H_i(F_3, P)$. It follows from Proposition 2.8 that $$H_i(F_1, P) = \frac{2}{3} \cdot 1 + \frac{1}{3} \cdot 0 = \frac{2}{3}.$$

Since $G = F_1 \cup F_2$, Proposition 2.7 implies that $H_i(G,P) \leq H_i(F_1,P) + H_i(F_2,P) = 4/3 \approx 1.33333$. Therefore, for this source and dependence relation, a compression scheme consisting of encoding the two edge projections and having the decoder use the edge projections to reconstruct a word in the equivalence class would require fewer bits per symbol on average than losslessly compressing the entire string. Since $F_1 \subset G$ and $F_2 \subset G$, Proposition 2.6 provides that $H_i(G,P) \geq H_i(F_1,P) \approx 0.66667$. Another lower bound on $H_i(G,P)$ follows from the fact that the complete graph on the vertex set is $G \cup F3$. Therefore, by subadditivity, $H(P) \leq H_i(G,P) + H_i(F_3,P)$ and so $H_i(G,P) \geq \log_2 3 - 2/3 \approx 0.91830$. Since G is a complete bipartite graph, Theorem 2.10 implies that $$H_i(G, P) = \log_2 3 - \frac{1}{3}\sum_{S=2}^{\infty}\left[\left(\frac{2}{3}\right)^S - 2\left(\frac{1}{2}\right)^S\right]\log_2(S) \approx 1.27645.$$

The following section considers some universal compression algorithms for the problem of representing interchange classes and begins with a discussion of normal forms.

Normal Forms and Variations

There are two types of normal forms which are frequently discussed in the trace theory literature. One of these is known as the lexicographic normal form and was first considered in A. V. Anisimov and D. E. Knuth, "Inhomogeneous Sorting," Int. J. Comp. Inform. Sci. 8, 255–260 (1979). The other normal form is called the Foata normal form, described in P. Cartier and D. Foata, "Problémes Combinatoires de Commutation et Réarrangements, Lecture Notes in Mathematics 85 (Springer, Berlin, 1969).

In order to compute either normal form, a total ordering on the vertex set V must be given. The lexicographic normal form of an interchange class is the unique word in the interchange class which is minimal with respect to the lexicographic ordering. Continuing the example considered in the introduction, assume a noncommutation graph G is given by a-b-c-d and suppose that a<b<c<d. The lexicographic normal form of the interchange class containing the two words ddbca and bdadc is baddc. It has been shown that a necessary and sufficient condition for a word w to be the lexicographic normal form of an interchange class is that for all factorizations w=xvyuz such that u and v are commuting symbols in V with u<v; x and z are possibly empty words over V, and y is a non-empty word over V, there exists a letter of y which does not commute with u.

In order to define the Foata normal form, the notion of finite non-empty subsets of pairwise independent letters is needed. Define the set F by $F=\{F \subseteq V | F$ is non-empty, F contains at most one appearance of any symbol $v \in V$, and every pair of symbols $u,v \in F$ with $u \neq v$ commute.$\}$ Each $F \in F$ is called an elementary step and it can be converted into a type class denoted by [F] consisting of words which are products of all of the elements of F.

The Foata normal form of an interchange class c is the unique string of elementary steps $v \in \phi_i$ with $r \geq 0$ and $\phi_i \in F$, $i \in \{1, 2, \ldots, r\}$, with the properties
$c = [\phi_1][\phi_2] \ldots [\phi_r]$
for each $1 \leq i < r$ and each letter $u \in \phi_{i+1}$ there exists a letter $v \in \phi_i$ either satisfying v=u or u and v are adjacent in the noncommutation graph G.

The number of elementary steps r in the Foata normal form is a measure of the parallel execution time associated with an interchange class. P. Cartier and D. Foata was the first to establish that the Foata normal form is well-defined and there are many proofs of this result. To return to the previous example, when the noncommutation graph G is given by a-b-c-d, it follows that $F=\{\{a\},\{b\},\{c\},\{d\},\{a,c\},\{a,d\},\{b,d\}\}$ and the Foata normal form for the interchange class containing the words ddbca and bdadc is $\{b,d\},\{a,d\},\{c\}$.

Figure 3:
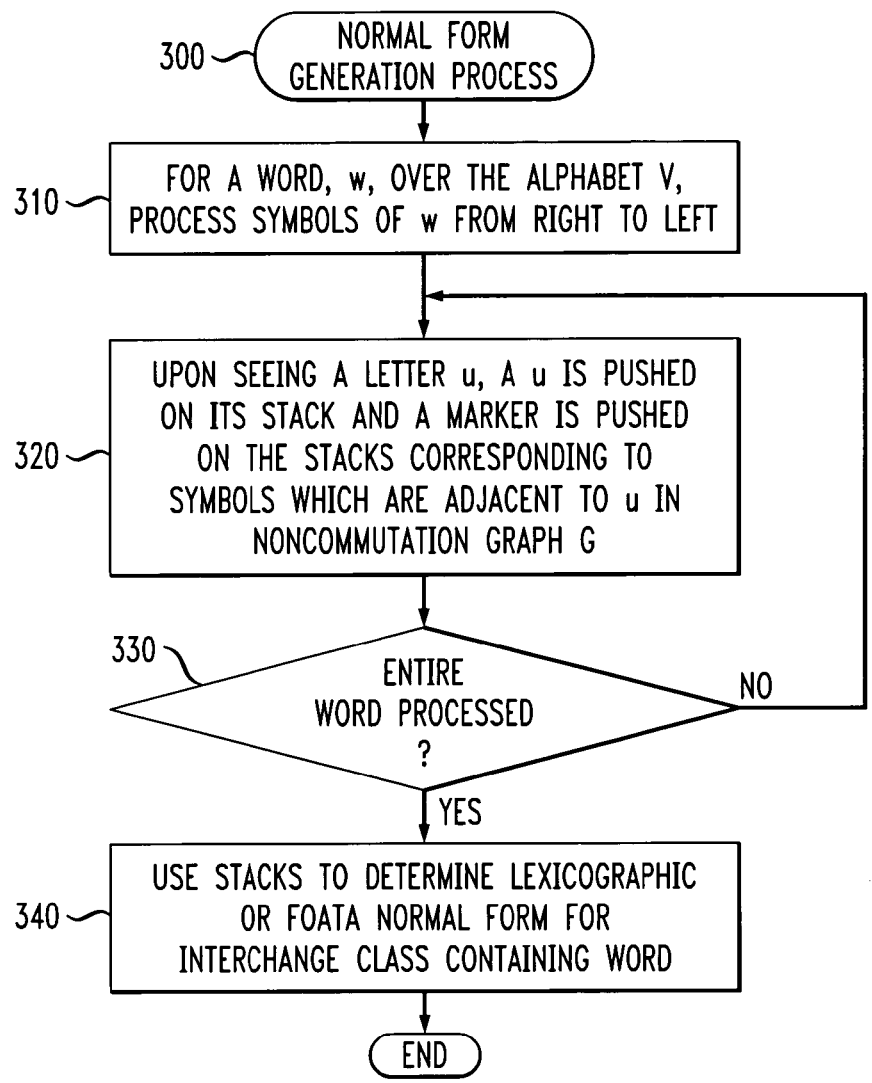
FIG. 3 is a flow chart describing an exemplary implementation of a normal form generation process that may be employed by the compression process of FIG. 2.

An algorithm (as well as exemplary pseudocode) to compute both the lexicographic normal form and the Foata normal form of an interchange class from one of its members was provided in D. Perrin, "Words Over a Partially Commutative Alphabet," in A. Apostolico and Z. Galil, ed., Combinatorial Algorithms on Words, NATO ASI Series, Volume F12, 329–340, (Springer, Berlin, 1985), incorporated by reference herein. FIG. 3 is a flow chart describing an exemplary implementation of the normal form generation process 300 that may be employed by the compression process of FIG. 2. The procedure employs a stack corresponding to each vertex $v \in V$. Let w be a word over the alphabet V. The symbols of w are processed during step 310 from right to left. Upon seeing a letter u, a u is pushed on its stack and a marker is pushed on the stacks corresponding to symbols which are adjacent to u in the noncommutation graph G during step 320. A test is performed during step 330 to determine if the entire word has been processed. When the entire word has been processed, the stacks can be used during step 340 to determine either the lexicographic normal form or the Foata normal form for the interchange class containing the word.

To obtain the lexicographic normal form: At each step the next letter of the normal form is the minimum letter u with respect to the lexicographic ordering which is currently at the top of some stack. u is popped from its stack and also pop a marker from each stack corresponding to a vertex $v \in V$ which is adjacent to u in G. This procedure is iterated until every stack is empty.

To derive the Foata normal form: At each step the members of the next elementary step are those letters which are on the tops of stacks. We pop these letters from their stacks and for each member u of the elementary step we also pop a marker from each stack corresponding to a letter $v \in V$ which does not commute with u. This procedure is iterated until every stack is empty.

Figure 4:
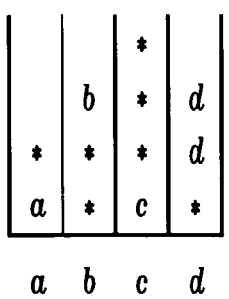
FIG. 4 illustrates stacks for the word ddbca when the dependence relation G is a-b-c-d.

Resuming the preceding example, when the dependence relation G is a-b-c-d and the original word is ddbca, the resulting stacks are shown in FIG. 4. It is straightforward to verify that the procedures specified above lead to baddc as the lexicographic normal form and $\{b,d\},\{a,d\},\{c\}$ as the Foata normal form.

Given these notions of normal forms, there are three categories of techniques that will be considered for transforming a source output string before a universal grammar-based lossless data compression scheme is applied. The first of these selects a total ordering on the vertex set V and finds the lexicographic normal form of the interchange class containing the source output string. Observe that for every pair of symbols u and v with u<v which commute in G, the lexicographic normal form derived from a word never contains the substring vu.

The other two categories of processing the source output string are based upon the Foata normal form. Let $F_1, F_2, \ldots, F_l$ be all of the elementary steps that constitute F; i.e., $F = U^l_{i=1} F_i$. For each $F_1$, one word $w_i$ is selected in the type class $[F_i]$. Therefore, for one category of source output string transformations the source output string is mapped into the concatenation of words obtained by replacing each elementary step in its Foata normal form with the corresponding representative word. Persisting with the foregoing example, if the dependence graph G is given by a-b-c-d and the words ca, ad, and db are selected to respectively represent the elementary steps {a,c},{a,d}, and {b,d}, then the strings in the interchange class containing the words ddbca and bdadc are all mapped into dbadc.

For the last transformation, a superalphabet $V^S$ of the vertex set V is defined corresponding to the I elements of F. For example, let $V_{ac}, V_{ad}$ and $V_{bd}$ be new letters respectively corresponding to the elementary steps {a,c}, {a,d}, and {b,d}. Each string is represented in an interchange class with the concatenation of superletters effected by substituting each elementary step in its Foata normal form with the analogous superletter. Continuing the last example, the words ddbca and bdadc would be transformed into $v_{bd}v_{ad}c$. The outcome of this last transformation is to map a word into a possibly shorter one over a larger alphabet. Observe that this representation of an interchange class highlights the parallelism leading to a minimal execution time.

The transformations defined above can be used for any noncommutation graph G. It is mentioned in passing that when G is not connected, the option is available of finding its components, projecting the original string onto each subalphabet consisting of the vertices of a component, and proceeding to use any of the three categories of normal form representations listed above for mapping the projections of the original string.

Combining Normal Forms and Irreducible Grammar-Based Codes

The normal form can be as the string which is the output of an auxiliary source. In general, the auxiliary source is not ergodic. For example, suppose you have a binary source which is not necessarily ergodic emitting the digits 0 and 1 and the digits commute. As discussed above, the interchange entropy of this source is zero. If the lexicographic order is selected 0<1 and the binary string contains 1 zeroes and m ones, then its lexicographic normal form is a run of 1 zeroes followed by a run of m ones, its Foata normal form is min{l,m} copies of the string 01 concatenated with 1−m zeroes if 1>m or m−1 ones if m>1, and the final transformation is min{l,m} copies of the auxiliary symbol $V_{01}$ followed by a run of 1−m zeroes if 1>m or m−1 ones if m>1. The first and third of these normal forms are piecewise stationary and the second one is piecewise ergodic. In each case, it can be shown that many compression schemes including LZ '78 and Sequitur will asymptotically approach zero bits per symbol on the output of the auxiliary source as the original string length approaches infinity.

To illustrate another difficulty, the example following Proposition 2.8 is again considered. Suppose once more that V={a,b,c,d},G=a-b c-d, and the source is an order-1 Markov chain with P(c|a)=P(d|b)=1,P(a|c)=P(b|c)=P(a|d)=P(b|d)=0.5. As discussed above, H(G,P)=H(P)=0.5 bits per symbol. Next assume that the total ordering of the vertex set is a<b<c<d and begin to process a source output string by converting it into its lexicographic normal form. Then, for a string of length 2N, the first N symbols look like the output of a binary, memoryless source with P(a)=P(b)=0.5. The remaining N symbols can be found from the first N by replacing each a with a c and each b with a d. It is in some respects accurate to state that the information rate of this auxiliary source is 0.5 bits per symbol. However, if a grammar-based code or any other practical lossless universal data compression algorithm is naively applied to the output of the auxiliary source, then the minimum average compression rate achievable will be 1 bit per symbol. The transformations based upon the Foata normal form are better suited for this particular compression problem.

Two instances are demonstrated below for which the auxiliary source is Markov with a countably infinite state space and which has the property that the auxiliary source entropy is equal to the original source's interchange entropy. Since a universal grammar-based code compresses an ergodic source to its entropy, the combined codes of the present invention compress a source to the interchange entropy in these special cases.

First consider dependence relations which are complete k-partite graphs. As in the section entitled "Interchange Complexity and Interchange Entropy," the vertex set V is represented by $V_1 \cup V_2 \cup \ldots \cup V_k, |V_i|=m_i, i \in \{1,2,\ldots,k\}$, the elements of $V_i$ are labeled as $V_{i,j}, i \in \{1,2,\ldots,k\}, j \in \{1,2,\ldots,m_i\}$ and it is assumed that every pair of vertices $\{v_{i,j}, v_{l,n}\}$, $v_{i,j} \in V_i, v_{l,n} \in V_l, l \neq i$, is an edge in the noncommutation graph G and that there is no edge consisting of two vertices from the same subset of vertices $V_i$ for any $i \in \{1,2,\ldots,k\}$. Again, consider the partitioning of the data string into a sequence of variable-length phrases corresponding to maximal runs of symbols from a vertex subset $V_i$.

An auxiliary source is specified which captures both the mapping into lexicographic normal form and the first transformation into Foata normal form. It is assumed that each phrase from the original source is converted to a string which is the unique designated representative for the type class for that phrase. The auxiliary source is then a countably infinite Markov chain where the state at any time consists of the suffix of the designated representative phrase beginning with the current symbol. While within a phrase the auxiliary source has no uncertainty in the transition from one state to the next; i.e., there is a single possible transition that occurs with probability 1. All of the uncertainty resides in the transition from the final letter in a phrase to the first state corresponding to the next phrase, and these transition probabilities depend only on the vertex subset associated with the current phrase. Let $H_a(K_{m_1,m_2,\ldots,m_k}, P)$ denote the entropy of the auxiliary source.

Theorem 4.1: Assume a discrete memoryless source with probability distribution P on the vertex set of a complete-k partite graph $K_{m_1,m_2,\ldots,m_k}$. Segment the output of the source into a sequence of variable-length phrases corresponding to maximal runs of symbols from a vertex subset. Replace each phrase by a string from the same type class which is the sole assigned representative for that particular type class. The entropy $H_a(K_{m_1,m_2,\ldots,m_k}, P)$ of this modified source satisfies $H_i(K_{m_1,m_2,\ldots,m_k}, P) = H_a(K_{m_1,m_2,\ldots,m_k}, P)$.

Consider the third transformation of the original source into an auxiliary source. In this case, the superalphabet $V^S$ consists of the union over all $i \in \{1,\ldots,k\}$ of all non-empty subsets of the vertex subset $V_i$. The source string of length n over the vertex set V is mapped into a generally shorter string over the superalphabet $V^S$. The definition of a phrase remains identical, and the requirement is maintained that each phrase from the original source be converted into a string over the superalphabet which is the unique designated representative for the type class for that phrase and from which the original string can be recovered.

Theorem 4.2: The entropy $H_a(K_{m_1,m_2,\ldots,m_k}, P)$ of an auxiliary source corresponding to the sequence of superletters given by the Foata normal form on the output of a discrete memoryless source with probability distribution P on the vertex set of a complete k-partite graph $K_{m_1,m_2,\ldots,m_k}$ satisfies $H_i(K_{m_1,m_2,\ldots,m_k}, P) = H_a(k_{m_1,m_2,\ldots,m_k}, P)$.

Consider the case where the noncommutation graph contains at least one vertex which is adjacent to all others. Let $V_a \subseteq V$ be the set of symbols which do not commute with any others. In this case, the source output string can be uniquely partitioned into a sequence of variable-length phrases consisting of zero or more symbols not in $V_a$ followed by a symbol in $V_a$. Since no symbol in $V_a$ commutes with any other, the projections onto the subalphabets associated with the various edges can be computed by the sequence of interchange classes corresponding to the phrases. Conversely, these projections can be used to determine this sequence of interchange classes. It follows from Theorem 2.1 that the minimum information required to perfectly reconstruct the interchange class containing a source output string is the sequence of interchange classes corresponding to the variable-length phrases. For a memoryless source, this sequence of interchange classes is an independent and identically distributed process. Thus, $H_i(G, P)$ can in principle be found using renewal theory. Let $U_1, U_2, \ldots, U_n$ denote a random string of length n. There are epochs $1 = M_1 < M_2 < \ldots$ for which the symbols $U_{M_l}, U_{M_l+1}\ldots$ make up the lth phrase, $l \geq 1$. Let $T_l = M_{l+1} - M_l$, $l \geq 1$, denote the number of symbols in the lth phrase and $R_l$ represent the self-information of the interchange class associated with phrase l. If $\sigma_l$ is the original source string corresponding to phrase l, then $R_l = -\log_2 [P(\sigma_l) \cdot |\Theta:\Theta \equiv_G \sigma_l|]$. Let $L(n) = \sup \{l: M_{l+1} \leq n+1\}$ denote the number of complete phrases by symbol n. The average self-information per symbol is bounded from below by $$\frac{\sum_{l=1}^{L(n)} R_l}{\sum_{l=1}^{L(n)+1} T_l}$$

and from above by $$\frac{\sum_{l=1}^{L(n)+1} R_l}{\sum_{l=1}^{L(n)} T_l}.$$

In the limit as $n \to \infty$, the following equation holds:

$$H_i(G, P) = \lim_{n \to \infty} \frac{L^{-1} \sum_{l=1}^{L} R_l}{L^{-1} \sum_{l=1}^{L} T_l} = \frac{\lim_{l \to \infty} E[R_l]}{\lim_{l \to \infty} E[T_l]}.$$

Next, consider auxiliary sources (viewed as a countably infinite Markov chain where the state at any time consists of the suffix of the present designated representative phrase beginning with the current symbol). While within a phrase, there is a single possible transition from one state to the next that occurs with probability 1. All of the uncertainty lies in the transition from the final letter in a phrase to the first state marking the beginning of the next phrase, and these transitions are independent and identically distributed. In order to compute the entropy $H_a(G, P)$ of the auxiliary source, the probability $\pi$ that the auxiliary source is on the last symbol of a phrase is needed. Consider a reward process where phrase 1 receives a reward of 1 unit corresponding to the last symbol in the phrase. The average reward per symbol is bounded from below by $$L(n) / \sum_{l=1}^{L(n)+1} T_l$$

and from above by $$[L(n)+1] / \sum_{l+1}^{L(n)} T_l.$$

In the limit as $n \to \infty$ the upper and lower bounds both approach $\alpha$ or $\pi = [\lim_{l \to \infty} E[T_l]]^{-1}$ almost surely. At the last symbol in a phrase, the probability that the next phrase from the auxiliary source is $\sigma$ is $P(\sigma) \cdot |\Theta:\Theta \equiv_G \sigma|$ if $\sigma$ is one of the designated strings representing the interchange class of a phrase and the probability is zero otherwise. It follows the formula for the entropy of a unifilar, Markov source that $H_i(G, P) = H_a(G, P)$.

Consider the case where the original source is a finite state, unifilar Markov source and the dependency graph is either a complete k-partite graph or a graph where at least one vertex is adjacent to all of the others. In this case, the interchange class of the phrases combined with some information about the state of the original process at the beginning and end of the phrases forms a countably infinite state, ergodic Markov chain. The exact states of the original process at the beginning and end of the phrases need not be necessary. For example, in the complete k-partite case if $V_j = i$ and there are distinct states which have the identical behavior when the source emits elements of $V_j$, they can be merged when describing the state preceding phrase 1. The process of transforming the original source into an auxiliary source maintains the information about the phrases and the correct transition probability from one phrase to the next. Hence, the entropy of the auxiliary source will be equal to the interchange entropy.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for compressing an input string, comprising the steps of:
    generating a lexicographic normal form from said input string, using only a single pass over said input string, wherein said input string has symbols belonging to a partially commutative alphabet; and
    applying a compression scheme to said lexicographic normal form.

2. The method of claim 1, wherein said compression scheme is a grammar-based lossless data compression scheme.

3. The method of claim 1, wherein said input string is one or more program instructions.

4. The method of claim 1, wherein said input string is one or more events in a communications network.

5. The method of claim 1, wherein said generating step further comprises the step of evaluating a set of equivalent words with respect to a noncommutation graph.

6. The method of claim 1, wherein said generating step further comprises the steps of:
    employing a stack corresponding to each vertex v∈V, where w is a word over an alphabet V;
    processing symbols of w from right to left;
    upon seeing a letter u, pushing a u on its stack and a marker pushed on the stacks corresponding to symbols which are adjacent to u in a noncommutation graph G; and
    once the entire word has been processed, using said stacks to determine said lexicographic normal form for an interchange class containing the word.

7. A method for compressing an input string, comprising the steps of:
    generating a Foata normal form from said input string, wherein said input string has symbols belonging to a partially commutative alphabet; and
    applying a compression scheme to said Foata normal form.

8. The method of claim 7, wherein said compression scheme is a grammar-based lossless data compression scheme.

9. The method of claim 7, wherein said input string is one or more program instructions.

10. The method of claim 7, wherein said input string is one or more events in a communications network.

11. The method of claim 7, wherein said generating step further comprises the step of evaluating a set of equivalent words with respect to a noncommutation graph.

12. The method of claim 7, wherein said generating step further comprises the steps of:
    employing a stack corresponding to each vertex ?∈V, where w is a word over an alphabet V;
    processing symbols of w from right to left;
    upon seeing a letter u, pushing a u on its stack and a marker on the stacks corresponding to symbols which are adjacent to u in a noncommutation graph G; and
    once the entire word has been processed, using said stacks to determine said Foata normal form for an interchange class containing the word.

13. A compression system, comprising:
    a memory; and
    a processor operatively coupled to said memory, said processor configured to:
    generate a normal form from said input string, using only a single pass over said input string, wherein said input string has symbols belonging to a partially commutative alphabet; and
    applying a compression scheme to said normal form.

14. The compression system of claim 13, wherein said compression scheme is a grammar-based lossless data compression scheme.

15. The compression system of claim 13, wherein said input string is one or more program instructions.

16. The compression system of claim 13, wherein said input string is one or more events in a communications network.

17. The compression system of claim 13, wherein said normal form is a lexicographic normal form.

18. The compression system of claim 13, wherein said normal form is a Foata normal form.

19. The compression system of claim 13, wherein said wherein said processor is further configured to evaluate a set of equivalent words with respect to a noncommutation graph.

20. The compression system of claim 13, wherein said wherein said processor is further configured to:
    employ a stack corresponding to each vertex v∈V, where w is a word over an alphabet V;
    process symbols of w from right to left;
    upon seeing a letter u, pushing a u on its stack and a marker on the stacks corresponding to symbols which are adjacent to u in the noncommutation graph G; and
    once the entire word has been processed, using said stacks to determine said normal form for an interchange class containing the word.

* * * * *

UNITED STATES PATENT AND TRADEMARK OFFICE
CERTIFICATE OF CORRECTION

PATENT NO. : 7,081,839 B2
APPLICATION NO. : 10/660117
DATED : July 25, 2006
INVENTOR(S) : Savari It is certified that error appears in the above-identified patent and that said Letters Patent is hereby corrected as shown below:

Column 5, line 8, after "et al. and" and before "D. Kirovski" replace "M. Drinićand" with --M. Drinić and--.

Column 7, line 20, that portion of the formula reading "$m^{-1}C_1(G,u_1 \ldots u_m)$" should read --$m^{-1}C_i(G,u_1 \ldots u_m)$--.

Column 9, line 34, that portion of the formula reading "$H_i = (G,P)$" should read --$H_i(G,P)$--.

Column 10, line 24, that portion of the formula reading "$/V_1/=m_i$" should read --$|V_i|=m_i$--.

Column 11, line 16, after "set is" replace "G u F3" with --$G \cup F_3$--.

Column 12, line 2, after "and" replace "$\phi_1 \in F$" with --$\phi_i \in F$--.

Column 13, lines 5-6, after "Let" and before "be" replace "$F_1, F_2, \ldots, F_1$" with --$F_1, F_2, \ldots, F_i$--; line 7, the formula reading "$F=U_{i=1}^1 F_i$" should read -- $F=U_{j=1}^I F_i$ --; line 7, after "each" and before "one" replace "$F_1$" with --$F_i$--.

Column 15, line 30, after "symbols" replace "$U_{M_I}, U_{M_I+1}-1$" with -- $U_{M_I}, U_{M_I+1}, \ldots, U_{M_{I+1}-1}$ --.

Column 16, line 29, replace "approach or π" with --approach π--.

In claim 6, column 17, line 47, after "vertex" replace "v Å V" with --$v \in V$--.

In claim 12, column 18, line 15, after "vertex" replace "? Å V" with --$v \in V$--.

In claim 19, column 18, line 46, before "processor" please remove "wherein said".

In claim 20, column 18, line 50, before "processor" please remove "wherein said".

UNITED STATES PATENT AND TRADEMARK OFFICE
CERTIFICATE OF CORRECTION

| | |
|---|---|
| PATENT NO. | : 7,081,839 B2 |
| APPLICATION NO. | : 10/660117 |
| DATED | : July 25, 2006 |
| INVENTOR(S) | : Savari |

It is certified that error appears in the above-identified patent and that said Letters Patent is hereby corrected as shown below:

In claim 20, column 18, line 51, after "vertex" and before "where" replace "v Å V" with --$v \in V$--.

Signed and Sealed this

Twenty-first Day of October, 2008

JON W. DUDAS
*Director of the United States Patent and Trademark Office*